(12) United States Patent
Riekels et al.

(10) Patent No.: US 7,378,705 B2
(45) Date of Patent: May 27, 2008

(54) SINGLE-POLY EEPROM CELL WITH LIGHTLY DOPED MOS CAPACITORS

(75) Inventors: James E. Riekels, New Hope, MN (US); Thomas B. Lucking, Maple Grove, MN (US); Bradley J. Larsen, Mound, MN (US); Gary R. Gardner, Golden Valley, MN (US)

(73) Assignee: Honeywell International, Inc., Morristown, NJ (US)

( * ) Notice: Subject to any disclaimer, the term of this patent is extended or adjusted under 35 U.S.C. 154(b) by 68 days.

(21) Appl. No.: 11/217,829

(22) Filed: Sep. 1, 2005

(65) Prior Publication Data

US 2007/0045710 A1 Mar. 1, 2007

(51) Int. Cl.
*H01L 29/788* (2006.01)

(52) U.S. Cl. ............... 257/315; 257/321; 257/E27.103

(58) Field of Classification Search ............... 257/315, 257/321, E27.103
See application file for complete search history.

(56) References Cited

U.S. PATENT DOCUMENTS

| | | | |
|---|---|---|---|
| 5,736,764 | A | 4/1998 | Chang |
| 5,841,165 | A | 11/1998 | Chang et al. |
| 5,886,376 | A | 3/1999 | Acovic et al. |
| 6,191,980 | B1 | 2/2001 | Kelley et al. |
| 6,690,056 | B1 | 2/2004 | Reedy et al. |
| 6,747,310 | B2 | 6/2004 | Fan et al. |
| 2002/0038882 | A1 | 4/2002 | Hartmann et al. |
| 2004/0021166 | A1 | 2/2004 | Hyde et al. |
| 2004/0037127 | A1 | 2/2004 | Lindhorst et al. |
| 2005/0030827 | A1* | 2/2005 | Gilliland et al. ............ 365/232 |
| 2005/0104119 | A1* | 5/2005 | Diorio et al. ............... 257/315 |
| 2007/0007577 | A1* | 1/2007 | Bandyopadhyay et al. . 257/315 |

OTHER PUBLICATIONS

Miyamoto, et al., "An Experimental 5-V-Only 256-kbit CMOS EEPROM with a High Performance Single-Polysilicon Cell," IEEE Journal of Solid State Circuits, vol. SC-21, No. 5, Oct. 1986, p. 852-860.

Ohsaki, et al., "A Single Poly EEPROM Cell Structure for Use in Stnadard CMOS Processes," IEEE Journal of Solid State Circuits, vol. 29, No. 3, Mar. 1994, p. 311-316.

D. Gogl, et al., "A Single-Poly EEPROM Cell in SIMOX Technology for High-Temperature Applications up to 250° C.," IEEE Electron Device Letters, vol. 18, No. 11, Nov. 1997, p. 541-543.

(Continued)

*Primary Examiner*—Phat X Cao
(74) *Attorney, Agent, or Firm*—McDonnell Boehnen Hulbert & Berghoff LLP

(57) ABSTRACT

An Electrically Erasable Programmable Read Only Memory (EEPROM) memory cell and a method of operation are disclosed for creating an EEPROM memory cell in a standard CMOS process. A single polysilicon layer is used in combination with lightly doped MOS capacitors. The lightly doped capacitors employed in the EEPROM memory cell can be asymmetrical in design. Asymmetrical capacitors reduce area. Further capacitance variation caused by inversion can also be reduced by using multiple control capacitors. In addition, the use of multiple tunneling capacitors provides the benefit of customized tunneling paths.

13 Claims, 8 Drawing Sheets

OTHER PUBLICATIONS

D. Gogl, et al., "A 1-Kbit EEPROM in SIMOX Technology for High-Temperature Applications up to 250° C.," IEEE Journal of Solid State Circuits, vol. 35, No. 10, Oct. 2000, p. 1387-1395.

De Salvo et al., "A New Extrapolation Law for Data-Retention Time-to-Failure of Nonvolatile Memories," IEEE Electron Device Letters, vol. 20, No. 5, pp. 197-199, (May 1999).

De Salvo et al., "Experimental and Theoretical Investigation of Nonvolatile Memory Data-Retention," IEEE Transactions on Electron Devices, vol. 46, No. 7, pp. 1518-1524 (Jul. 1999).

Papadas et al., "Modeling of the Intrinsic Retention Characteristics of FLOTOX EEPROM Cells Under Elevated Temperature Conditions," IEEE Transactions on Electronic Devices, vol. 42, No. 4, pp.678-681 (Apr. 1995).

Sune et al., "Temperature Dependence of Fowler-Nordheim Injection form Accumulated n-type Silicon into Silicon Dioxide," IEEE Transactions on Electronic Devices, vol. 40, No. 5, pp. 1017-1019 (May 1993).

\* cited by examiner

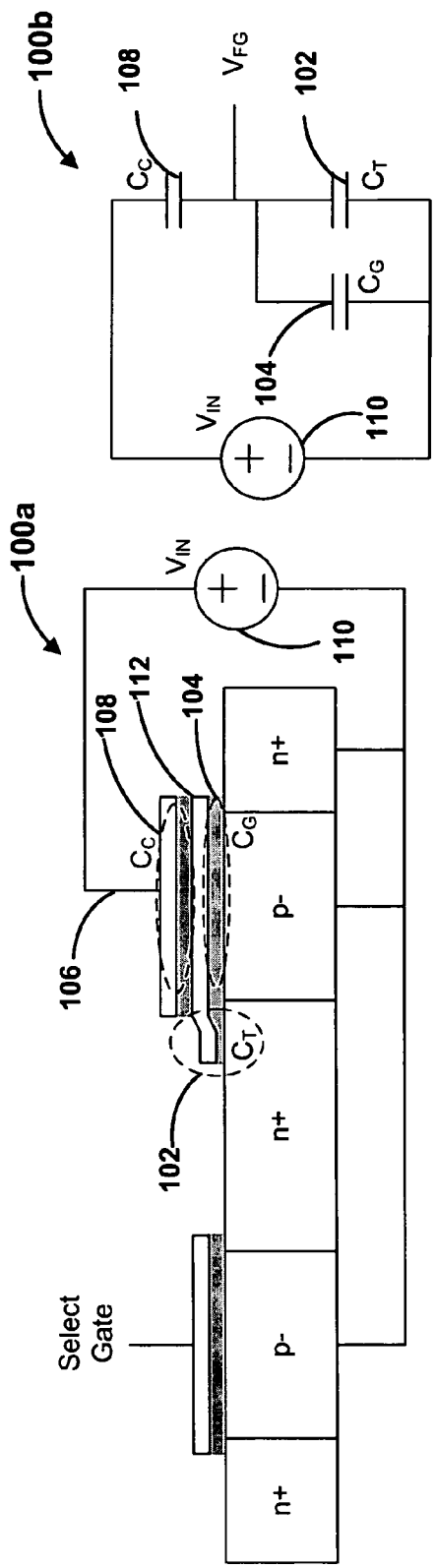
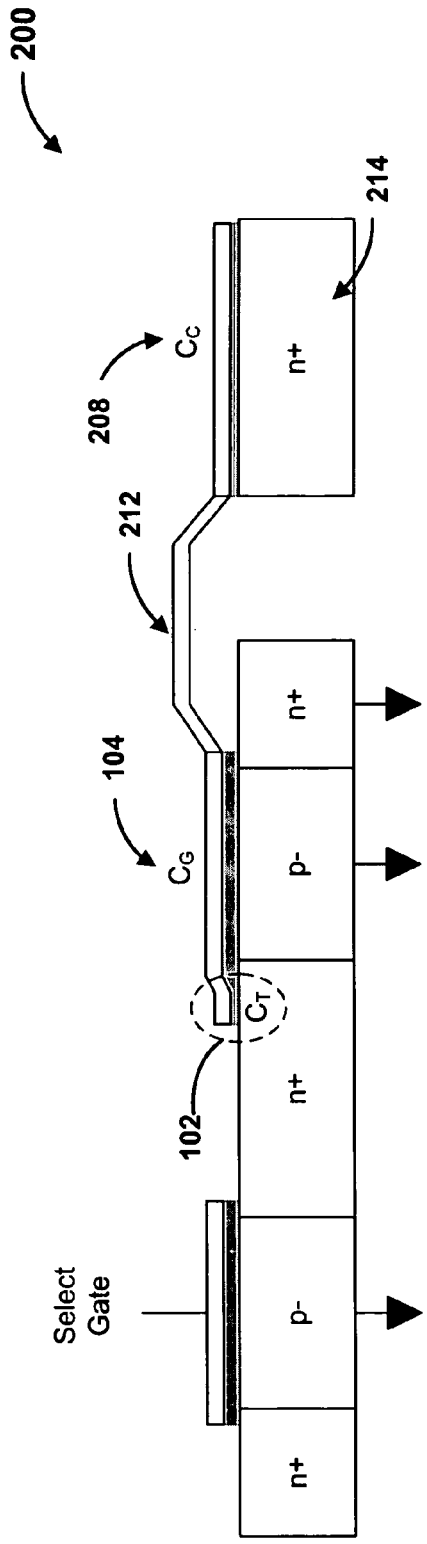
FIG. 1a Prior Art
FIG. 1b Prior Art
FIG. 2 Prior Art

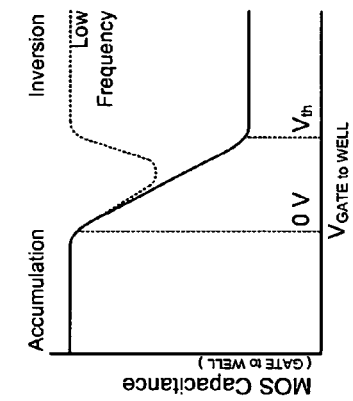
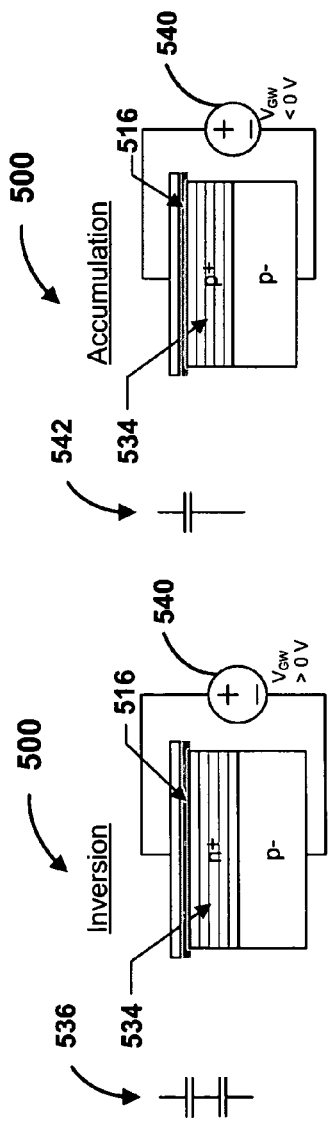
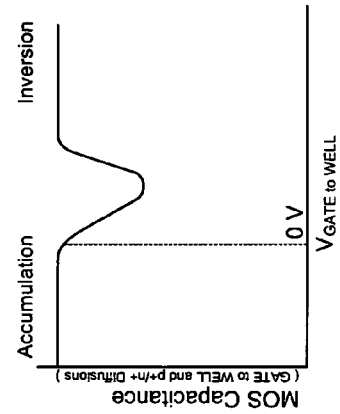
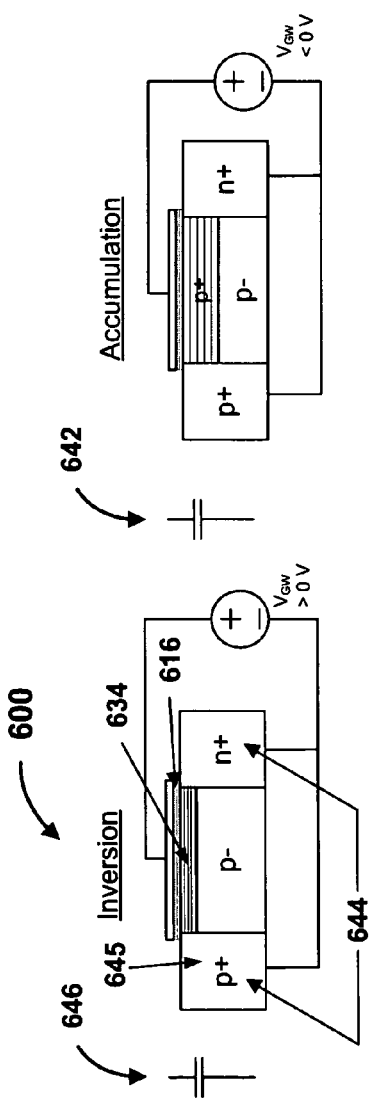

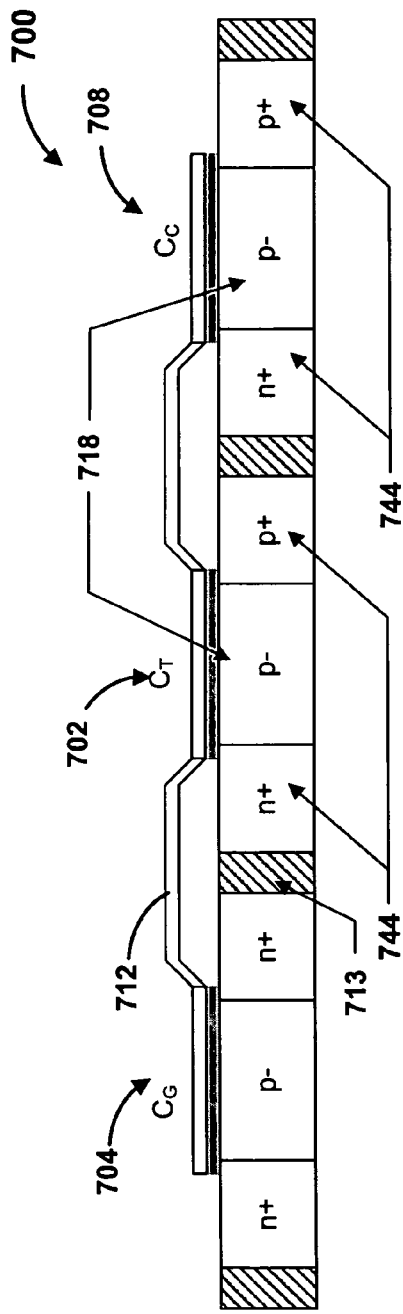
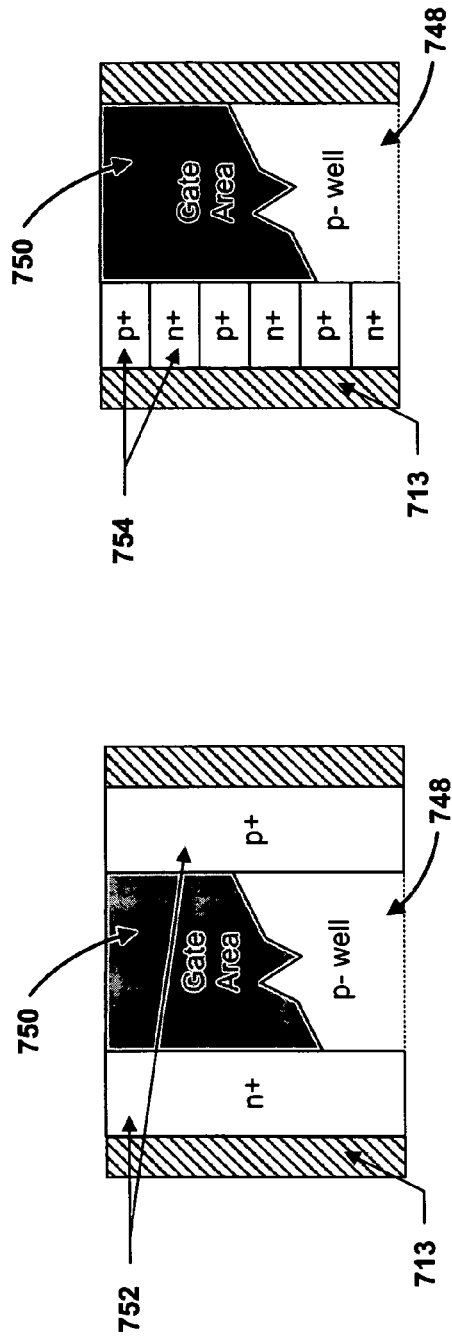
FIG. 7a
FIG. 7b
FIG. 7c

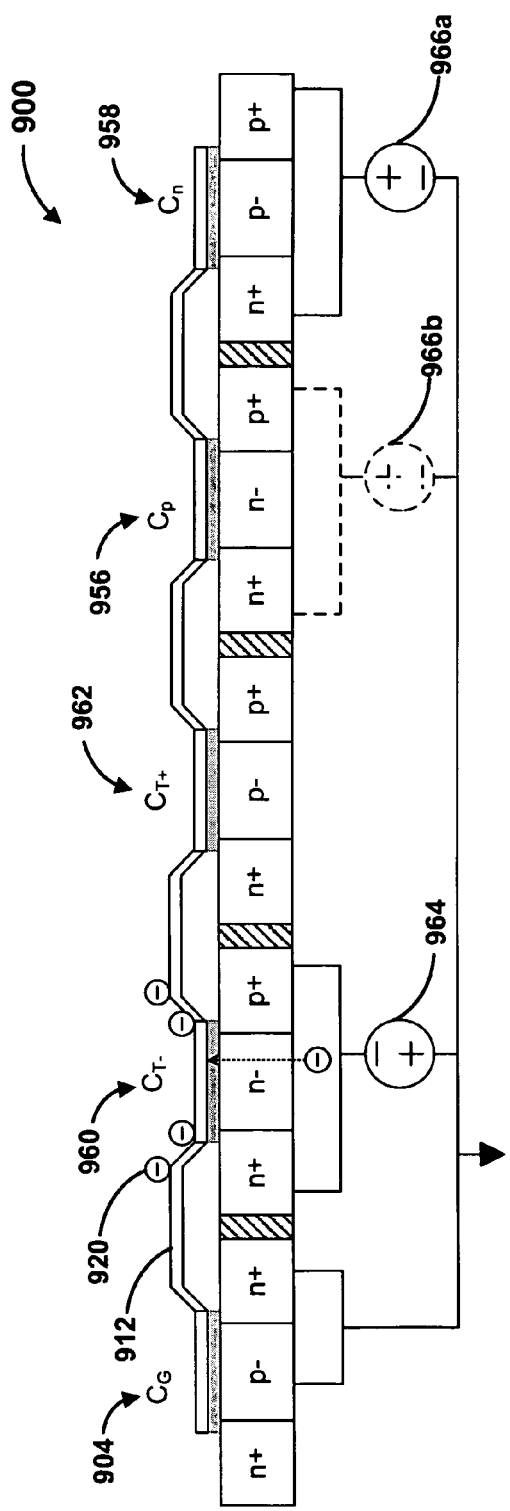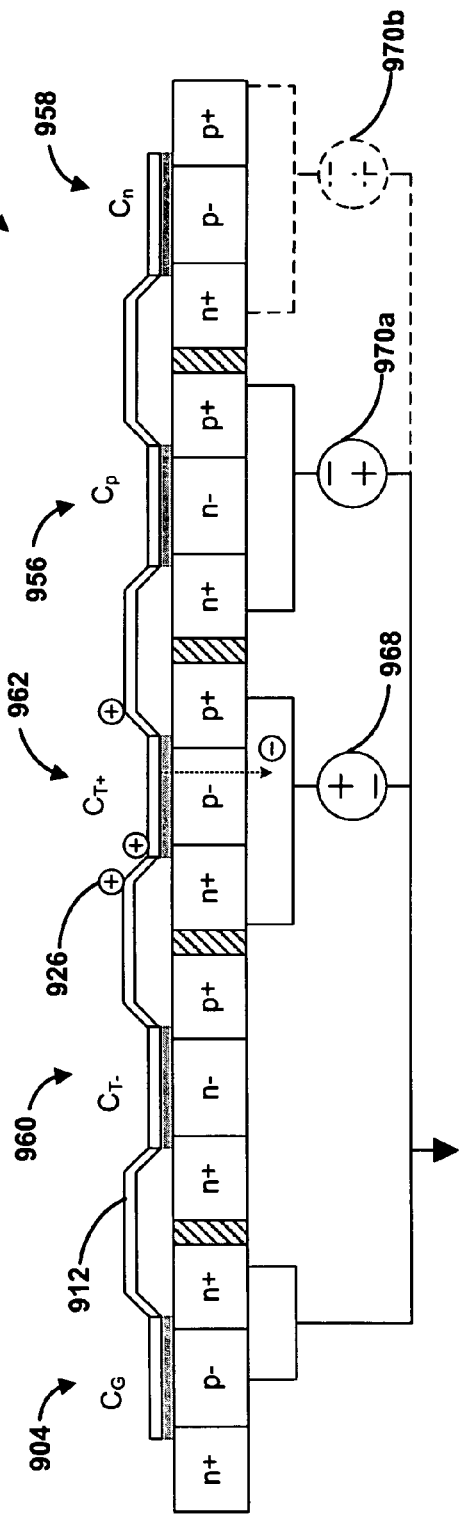
FIG. 9a
FIG. 9b

SINGLE-POLY EEPROM CELL WITH LIGHTLY DOPED MOS CAPACITORS

GOVERNMENT RIGHTS

The United States Government has acquired certain rights in this invention pursuant to Contract No. DE-FC26-03NT41834 awarded by the Department of Energy.

BACKGROUND

1. Field of Invention

The present invention relates to the field of memory cells, and specifically to a single-poly memory cell fabricated in a standard CMOS process flow.

2. Description of Related Art

One of the recent developments in Electrically Erasable Programmable Read Only Memory (EEPROM) cells has been the use of a single polysilicon deposition process to form a link between a control capacitor, a tunneling capacitor and an EEPROM Field Effect Transistor (FET). Because there may be no direct electrical connections to the single-poly layer, it is referred to as a 'floating gate'. The floating gate also forms the gate of the EEPROM FET. Before the use of a single poly layer, an EEPROM cell was typically constructed from two poly layers. One such dual-poly EEPROM cell 100a is illustrated in FIG. 1a. A goal of the dual-poly EEPROM cell is to tunnel electrons through the tunneling capacitor 102 onto the floating gate 112. By way of capacitive coupling, a voltage potential 110 is applied to the top plate connection 106 of the control capacitor 108 and this applied voltage is realized across the tunneling capacitor 102 and the FET gate capacitance 104. The applied potential will cause electrons, via Fowler-Nordheim (FN) tunneling, to tunnel through the tunneling capacitor 102 and onto the floating gate 112. Electrons are removed in a similar way but with an opposite applied potential across the tunneling capacitor 102.

FIG. 1b is a schematic drawing of the control capacitor 108, tunneling capacitor 102, and FET gate capacitor 104 drawn in the cross-section of FIG. 1a. In order for a significant amount of applied voltage to be distributed across the tunneling capacitor 102, the capacitance of the control capacitor 108 should be much larger than the sum of the tunneling capacitor 102 and FET gate capacitor 104. The output voltage across the tunneling capacitor is calculated as:

$$V_{FG} = \frac{C_C}{C_C + C_T + C_G} \cdot V_{IN}$$

When $C_c \gg (C_T + C_G)$ this simplifies to:

$$V_{FG} \approx \frac{C_C}{C_C} \cdot V_{IN} = V_{IN}$$

and essentially very little of the applied voltage is lost across the control capacitor 108.

A goal of single-poly memory cells is to operate in the same manner as a dual-poly EEPROM cell, but to lessen additional processing steps outside the process flow of standard CMOS processing. Thus far, however, this goal may not be completely realized. For example, FIG. 2 is a cross section of a typical single-poly EEPROM cell 200. The dual polysilicon stack is eliminated and a single poly layer 212 connects the tunneling 102, FET gate 104, and control 208 capacitors. In addition, the control capacitor 208 is constructed from an n+ well 214 and a thin oxide layer is grown on the well. In this example, the single-poly EEPROM cell 200 is easier to manufacture in standard CMOS processing because it may be manufactured with only one polysilicon deposition step and fewer overall fabrication steps. However, this particular single-poly EEPROM may not be completely manufacturable with a standard CMOS process flow in that it requires additional fabrication steps to support the oxide on top of the n+ diffusion 214 that forms part of the control capacitor 208.

In the above example, the n+ diffusion 214 provides contact to the bottom plate of the control capacitor and eliminates the voltage dependency of the control capacitor 208. Typically, the control capacitor oxide is grown from the n+ diffusion 214 to ensure quality oxide that provides good electrical insulation. That is, the control capacitor oxide does not easily allow charge stored on the single poly layer 212 to leak away. Given that it is desirable to have the control capacitance much larger than the capacitance of other capacitors connected to the single poly layer, the thickness of the oxide of the control capacitor is usually less than or equal to the thickness of the oxide of the tunneling or FET capacitor. The need for thin oxide grown on a heavily doped (n+) region implies additional processing that is beyond the scope of the standard CMOS process. Therefore, one object of the present application is to provide a single-poly memory device that is constructible in a standard CMOS processing flow.

SUMMARY

An EEPROM memory cell is described. The EEPROM memory cell is manufacturable in a standard CMOS process with little or no additional non-standard processing. The EEPROM memory cell employs single polysilicon processing. In addition, the EEPROM memory cell uses tunneling and control capacitors with lightly doped regions under each capacitor's oxide. The tunneling and control capacitors are used to move electrons on and off a floating polysilicon gate.

Various arrangements of capacitors are disclosed in this application. The EEPROM memory cell can be manufactured with one or more tunneling capacitors as well as one or more control capacitors. Multiple tunneling capacitors allow for selective tunneling paths. Additionally, multiple control capacitors operated in parallel allow for reduced variation in capacitance when biased in or around inversion.

Other methods for reducing capacitance variation due to inversion are also disclosed in this application. These methods include implementing asymmetrical MOS capacitors. A method of laying out the asymmetrical doping regions within the MOS capacitors is also disclosed.

A method for applying bias to the bottom plates of the capacitors within an EEPROM memory cell is also disclosed. This method may reduce the need for large bias voltages and it also prevents electrons from tunneling through the oxide of the FET gate capacitor. In addition, this method reduces damage that may occur at the gate oxide of the MOSFET. This damage may alter the conduction properties of the MOSFET transistor.

These as well as other aspects and advantages of the present invention will become apparent to those of ordinary skill in the art by reading the following detailed description, with appropriate reference to the accompanying drawings.

BRIEF DESCRIPTION OF THE DRAWINGS

Embodiments of the present invention are described with reference to the following drawings, wherein:

FIG. 1a is a cross-sectional drawing of a dual-poly EEPROM cell;

FIG. 1b is one embodiment of a schematic drawing of a circuit representation of the control capacitor, tunneling capacitor and FET gate capacitor depicted in FIG. 1a;

FIG. 2 is a cross-sectional drawing of a single-poly EEPROM cell;

FIG. 5a is a cross-sectional drawing of an example MOS capacitor, constructed in a conventional manner and operating in inversion;

FIG. 5b is a cross-sectional drawing of an example MOS capacitor, constructed in a conventional manner and operating in accumulation;

FIG. 5c is an example graph illustrating the capacitance loss in inversion corresponding to a MOS capacitor constructed in a conventional manner;

FIG. 6a is a cross-sectional drawing of a MOS capacitor, constructed in an asymmetrical manner and operating in inversion in accordance with one embodiment of the present invention;

FIG. 6b is a cross-sectional drawing of a MOS capacitor, constructed in an asymmetrical manner and operating in accumulation in accordance with one embodiment of the present invention;

FIG. 6c is a graph illustrating the increased capacitance in inversion corresponding to a MOS capacitor constructed in an asymmetrical manner in accordance with one embodiment of the present invention;

FIG. 7a is a cross-sectional drawing of a single-poly EEPROM cell implementing asymmetrical tunneling and control MOS capacitors in accordance with one embodiment of the present invention;

FIG. 7b is a top view of an asymmetrical MOS capacitor with n+ and p+ doped regions placed on opposite sides of the gate oxide in accordance with one embodiment of the present invention;

FIG. 7c is a top view of an asymmetrical MOS capacitor with n+ and p+ doped regions placed adjacent to each other for area optimization in accordance with one embodiment of the present invention;

FIG. 9a is a cross-sectional view of electron placement onto a floating gate of a single-poly EEPROM cell implementing two control capacitors and two tunneling capacitors in accordance with one embodiment of the present invention;

FIG. 9b is a cross-sectional view of electron removal from a floating gate of a single-poly EEPROM cell implementing two control capacitors and two tunneling capacitors in accordance with one embodiment of the present invention.

DETAILED DESCRIPTION

An EEPROM memory cell that is manufacturable in a standard CMOS process is presented. MOS capacitors are connected to each other via a single polysilicon line. Each capacitor has an oxide layer that is typically the thickness of the gate oxide of a FET transistor. Beneath the oxide layer is a lightly doped region. The lightly doped region may be manufactured in a standard process, such as a standard well implant, or it may even be the background doping of a semiconductor substrate. All of these processing methods, particularly when combined, allow an EEPROM cell to be created in a standard CMOS process.

One advantage of creating an EEPROM cell in a standard CMOS process is that a circuit designer can use the same semiconductor processing steps for a particular Application Specific Integrated Circuit (ASIC) and an array of EEPROM memory cells. This would allow both devices to be created side by side without altering a process flow. Altering the process flow includes adding additional process steps that may significantly increase the cost of fabrication of an EEPROM cell. Also, altering the process flow may introduce process variation and produce deviations in Statistical Process Control (SPC). Variations and deviations in processing can cause a reduction in yield as well as reduced circuit reliability.

In addition to introducing an EEPROM cell manufacturable in conventional CMOS processes, EEPROM cells with MOS capacitors that have an alternative structure than typical MOS capacitors are also introduced. Various methods for operating EEPROM cells are also disclosed. These methods provide advantages such as reduced bias levels, customized tunneling paths and decreased oxide damage.

Figure 3A:
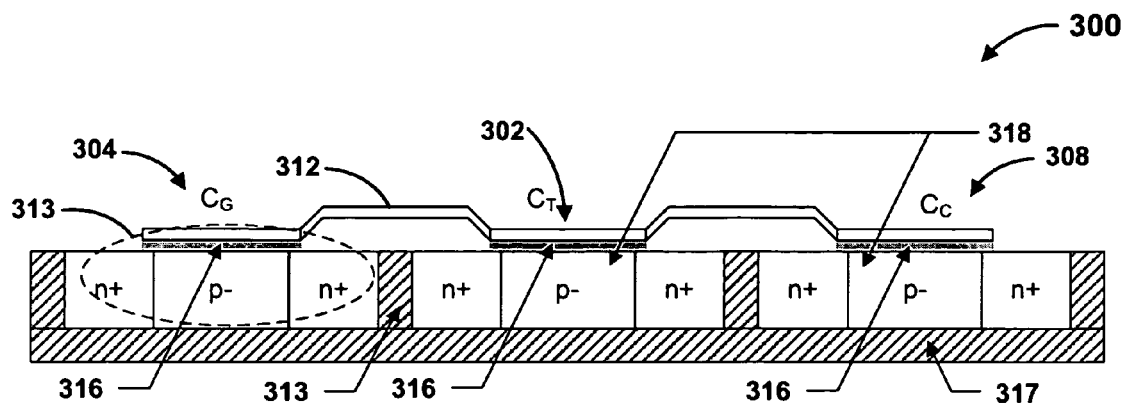
FIG. 3a is a cross-sectional drawing of a single-poly EEPROM cell in accordance with one embodiment of the present invention.

Turning now to the figures, FIG. 3a is one embodiment of a CMOS compatible single-poly EEPROM memory cell 300. This device comprises a tunneling capacitor 302, a MOSFET gate capacitor 304, and a control capacitor 308. In order to conform with standard CMOS processing, each capacitor comprises an oxide layer 316, typically grown during a gate oxidation step. This oxide forms the dielectric of the tunneling capacitor 302, the MOSFET gate capacitor 304, and the control capacitor 308. Each capacitor, however, can include different oxides or oxide thicknesses depending on design parameters, for example.

In this embodiment and in further embodiments, a bottom plate may provide electrical connection to capacitors of an EEPROM memory cell. The bottom plate comprises the lightly and heavily doped silicon layers below and/or adjacent to a MOS capacitor's oxide. The bottom plate may include an additional heavily doped region (not shown in some of the figures) in order to provide electrical contact to a capacitor's well (the lightly doped region under the oxide). The location of this well contact may be optimized. For example, it may be placed adjacent to the lightly doped region under the oxide or some distance away provided it is in contact with some portion of the lightly doped region comprising the well. The placement of the well contact of the bottom plate will be further discussed in FIG. 6a. The placement of the well contact does not limit the scope of the present invention. Some of the illustrations may not illustrate a well contact. For example, when direct electrical contact is shown to a lightly doped region, it is assumed that electrical contact is made to a heavily doped region. The heavily doped region is of the same doping type as the lightly doped region that it is in contact with.

Returning to FIG. 3a, each capacitor in the embodiment of FIG. 3a is constructed from a symmetrical well MOS device with a lightly doped region 318 in between two heavily doped regions. The doping density of the lightly doped region is less than the adjacent more heavily doped regions. The heavily doped region may have a doping density on the order of $10^{22}$ atoms/cm$^3$ and the lightly doped region may have a doping density on the order of $10^{18}$ atoms/cm$^3$, for example. Or, in another example, the lightly doped region may have an intrinsic doping level.

The top plates of all three capacitors are connected via a continuous poly line 312, referred to as the floating gate. Each capacitor is isolated from one another via shallow trench isolation (STI) 313, LOCOS or other conventional electrical isolation means. A silicon on insulator (SOI) substrate 317 is employed in the embodiment of FIG. 3a. However, the EEPROM cell 300 is not limited to a SOI substrate.

Figure 3B:
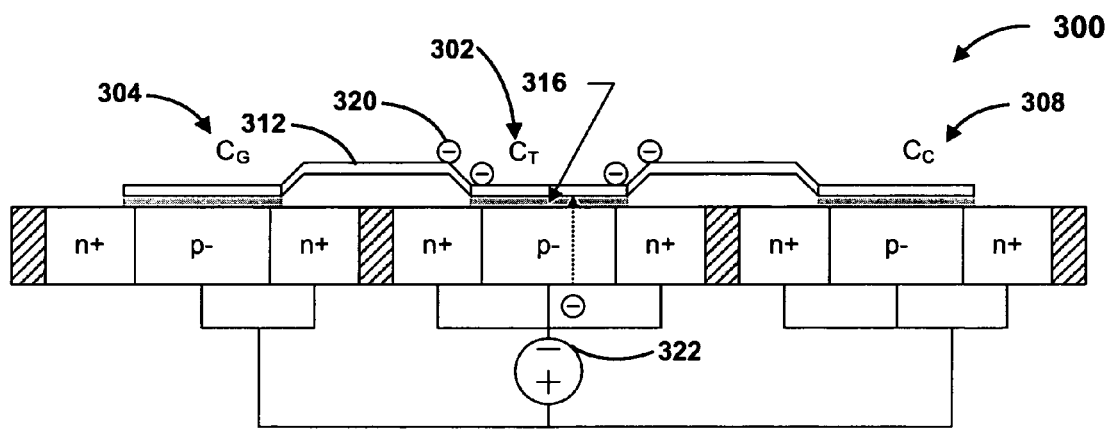
FIG. 3b is a cross-sectional drawing of a single-poly EEPROM cell in accordance with one embodiment of the present invention, depicting electron placement onto a floating gate.

The memory cell 300 may be used to store data in the form of electrical charges. To store a charge, a "write" operation is performed. A "read" operation, on the other hand, is used to measure the presence and polarity of stored charge. FIG. 3b illustrates an example "write" operation being performed on the memory cell 300. A negative bias 322 is applied to the bottom plate of the tunneling capacitor 302 relative to the bottom plate of the control capacitor 308. This negative applied bias allows electrons 320 to tunnel through the tunneling oxide 316 of the tunneling capacitor 302. The electrons 320 form a charge on the floating gate 312 which can then be detected in a "read" operation using the MOSFET 313. Typically a "read" operation measures a shift in the I-V characteristics of the memory cell 300 (i.e., a threshold voltage ($V_t$) shift in MOSFET 313).

Figure 3C:
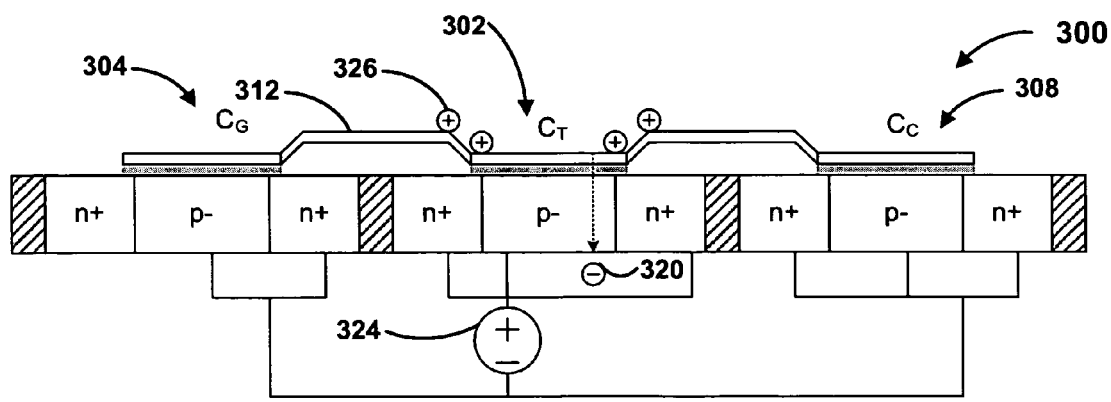
FIG. 3c is a cross-sectional drawing of a single-poly EEPROM cell in accordance with one embodiment of the present invention, depicting electron removal from a floating gate.

As described above, and alternative to the embodiments shown in FIGS. 3a-c, MOS capacitors that comprise an n-type lightly doped region, or even an intrinsically doped region may be used. For example, tunneling capacitor 302 and control capacitor 308 may be made with very lightly doped n-type regions. In addition, the bias 322 may be controlled by another means, such as a general processor, which may be controlled by a user. Thus according to user input, charge may be stored on the memory cell 300.

One advantage to the region underneath the tunneling oxide 316 being lightly doped is that if the oxide for the tunneling and control capacitors are grown in the gate oxidation step, the oxide will not have an enhanced growth rate. Typically in high temperature processes (e.g., a gate oxidation furnace), heavily doped regions grow thicker oxides than do lightly doped regions (for the same duration of time in the furnace). For example, a gate oxide grown on the gate capacitor 304 might be about 70-200 Å thick. A heavily doped region can grow an oxide about 1.2-5 times faster than a lightly doped region during a gate oxidation step. Because lightly doped regions do not grow thick oxides, thick oxides that would typically be grown in a gate oxidation step do not need to be subsequently etched and re-grown or re-deposited, for example. Thus, the number of processing steps is reduced.

In addition to reducing extra processing steps, keeping the oxide of the tunneling and control capacitors thin allows the tunneling mechanism of electrons to be FN. Using thinner oxides allows device functionality with lower applied currents and voltages. Despite using thin oxides, if high voltages or currents are applied this may cause electrons to tunnel via HE tunneling. HE tunneling is a more damaging to oxide layers than FN tunneling. In the disclosed embodiments of this application, the dominant tunneling mechanism used to "write" the EEPROM memory cells is FN tunneling. However, large voltages and/or currents may be applied to the EEPROM MOSFET so that HE tunneling mechanisms are used instead or in combination with FN tunneling mechanisms.

An illustration of electron charge being removed from the floating gate 312 via FN tunneling is shown in FIG. 3c. This too is a "write" operation. A positive bias 324 is applied to the bottom plate of the tunneling capacitor 302 relative to the bottom plate of the control capacitor 308. The applied positive 324 bias allows electrons 320 to tunnel through the tunneling oxide 316 of the tunneling capacitor 302. A positive charge 326 cancels the negative charge that was previously accumulated on the floating gate 312. A "read" operation detects the shift in the I-V characteristics of the memory cell 300 (i.e., a $V_t$ shift). In addition, a positive charge can be accumulated if even more electrons 320 are removed than were originally tunneled onto the floating gate 312. This also will create a shift in I-V characteristics.

Figure 4A:
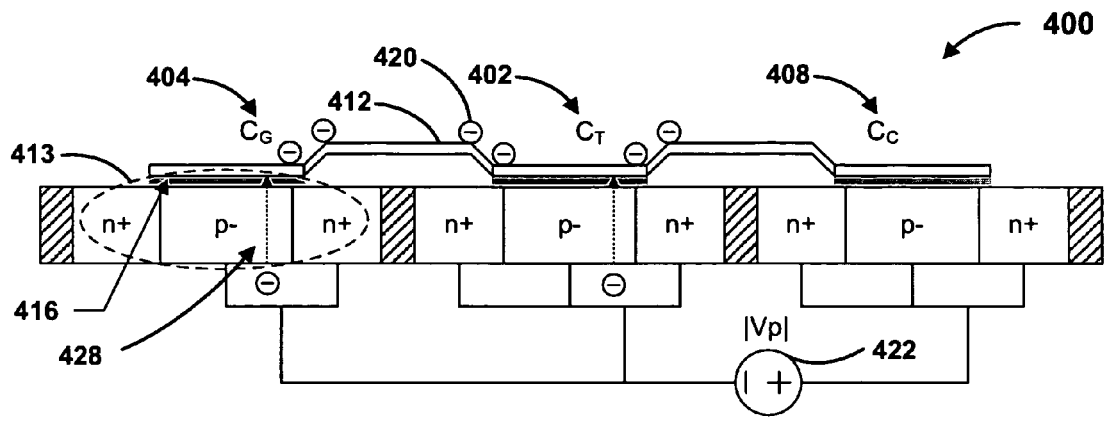
FIG. 4a is a cross-sectional drawing of a single-poly EEPROM cell in accordance with one embodiment of the present invention, operated in a non-differential manner.

Although tunneling is expected to occur through a tunneling capacitor, it may also tunnel through the gate capacitor of a MOSFET. One such example is shown in FIG. 4a. Relative to the bottom plate of the control capacitor 408, a negative polarity of applied bias $V_P$ 422 is applied to the bottom plates of a MOS gate capacitor 404 and tunneling capacitor 402. The applied bias 422 is sufficient enough to cause tunneling through the oxide of both the gate capacitor 404 and the tunneling capacitor 402. This may be problematic because it may cause damage to the oxide 416 of the gate capacitor 404. This damage can affect the conduction properties (I-V curves) of a MOSFET transistor 413 that comprises gate capacitor 404 by creating trapped charge under/in the gate oxide. Because an EEPROM cell is measuring changes in stored charge, the additional traps are an undesired effect. Thus, FN tunneling through the gate oxide of the MOSFET transistor 413 may be avoided to ensure better operation/yield of the memory cell.

Figure 4B:
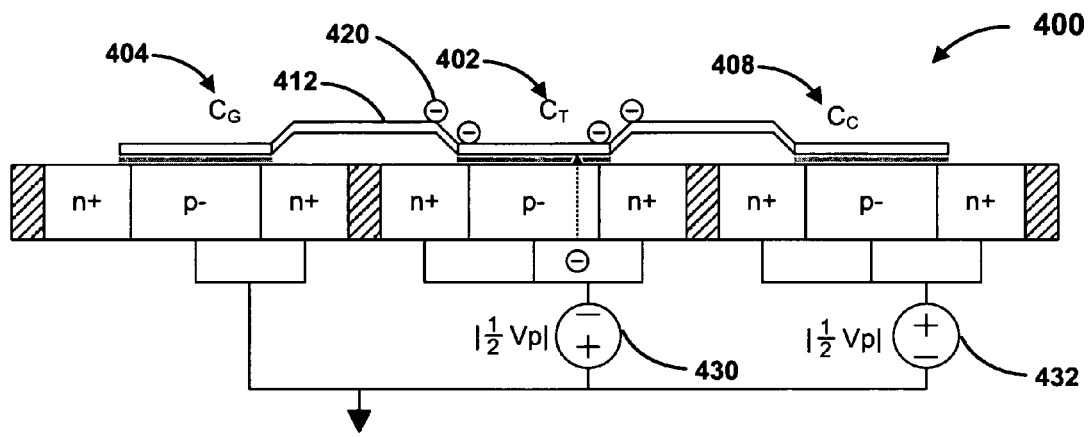
FIG. 4b is a cross-sectional drawing of a single-poly EEPROM cell in accordance with one embodiment of the present invention, operated in a differential manner placing electron charge on a floating gate.
Figure 4C:
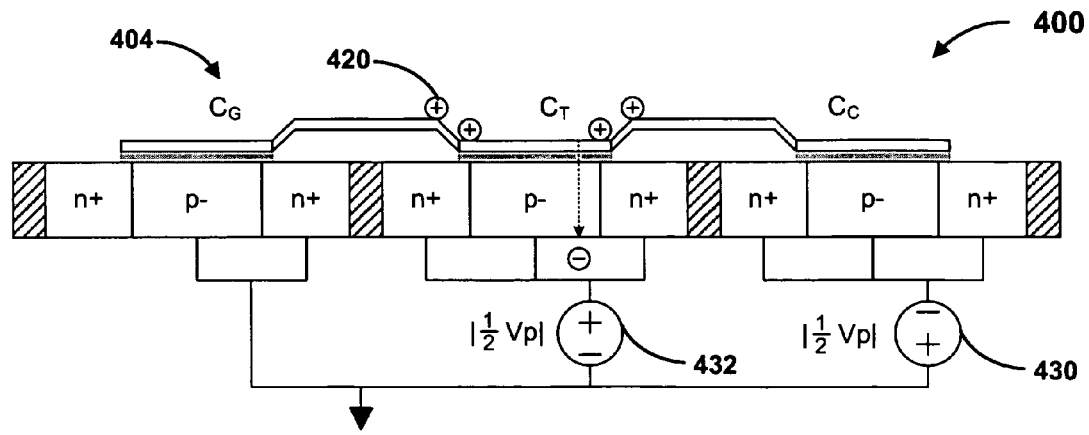
FIG. 4c is a cross-sectional drawing of a single-poly EEPROM cell in accordance with one embodiment of the present invention, operated in a differential manner removing electron charge from a floating gate.

FIG. 4b illustrates one method of preventing FN tunneling through the gate capacitor 404. By dividing the applied voltage 422 in half (or at least two components that equal the sum of the applied voltage 422) and distributing one voltage component 430 to the bottom plate of the tunneling capacitor 402 and another voltage component 432 to the bottom plate of the control capacitor 408, FN tunneling onto the gate capacitor 404 is lessened or prevented as it only sees one half of the voltage necessary for FN tunneling. This results because the bottom plate of the gate capacitor 404 is tied to the node joining voltage components 430 and 432. Thus, less voltage is applied across the gate capacitor 404 than is applied in the configuration of FIG. 4*a*. Similar to FIG. 3*b*, a "write" operation is performed by tunneling electrons 420 onto the gate capacitor 404. FIG. 4*c* illustrates removing electrons 420 from the gate capacitor 404 by reversing the polarities of the voltage components 430 and 432 in a manner analogous to that illustrated in FIG. 3*c*.

Dividing the applied bias into components also helps in managing the limitations imposed by the process technology. This benefit may be equally or even more important than preventing FN tunneling through the gate capacitor 404. As shown in FIG. 4*a*, a single voltage applied to the tunneling capacitor 402 can be used to control and initiate the tunneling. However, applying all the voltage to just one point may require the voltage to be large and of both polarities (in some technologies this may be ±15-20 V, for example). Some CMOS technologies may not be able to control large voltages. By splitting the voltage into two components, however, voltages applied at different terminals may make applying voltage more manageable. Furthermore, SOI, with its device isolation, may be particularly suited to the use of bipolar voltages, for example. In contrast, bulk processes may require the use of triple-well technologies to support and manage the bipolar voltages.

Improvements can also be made to an EEPROM memory cell by altering the structure of MOS capacitors that an EEPROM memory cell comprises. A typical MOS capacitor 500 is illustrated in FIGS. 5*a*-*b*. FIG. 5*a* illustrates inversion mode capacitance that is generated when a typical MOS capacitor 500 is operated in inversion. Normally, when a MOS capacitor is operated in inversion (e.g., a positive (gate to well) bias for p-MOS capacitors and a negative bias for n-MOS capacitors), a reduction in overall capacitance is induced (except at low frequencies). This reduction is illustrated in the graph of FIG. 5*c*. The reduction in capacitance is due to minority carriers being collected in a small region 534 below a gate oxide 516. Enough minority carriers are collected to raise the Fermi energy level of the bandgap to that of an opposite doping type, hence the term inversion. Essentially a reduction in capacitance results because the inversion region creates two capacitors operated in series 536. This can be problematic for circuit designers because in order to guarantee a minimum capacitance during standard operation (such as a guaranteed ratio between tunneling and gate capacitors, and a control capacitor), the area of the MOS capacitor and the area of an EEPROM cell often need to be increased. Increasing the area of the EEPROM cell is not always a viable option for circuit designers since the design area on an integrated circuit is often very limited.

Operating the MOS capacitor 500 in accumulation does not pose the same problem. In FIG. 5*b* a MOS capacitor 500 is shown being operated in accumulation. As the term suggests, accumulation results when majority carriers accumulate in the small region 534 under the gate oxide 516. Majority carriers move from within the entire lightly doped region. Depending on the doping of the capacitor, this moves the Fermi energy closer to either the valence band or conduction band of the semiconductor material. The result is that the lightly doped region under the oxide maintains a constant capacitance independent of applied bias 540. Thus, circuit designers view MOS capacitors, and in turn, the capacitors that make up an EEPROM cell as comprising a single capacitor 542 when operated in accumulation.

Despite the benefits of operating in accumulation, it is often not possible to maintain a MOS capacitor in accumulation mode throughout the entire operation of an EEPROM cell. Often times in integrated circuits, voltages are applied at a frequency and cycled through high and low values. Therefore, a MOS capacitor is often in accumulation or inversion. So, despite the advantages of stable capacitance in accumulation mode, it is important to compensate for, or reduce, capacitance losses when a MOS capacitor is operated in inversion.

The problems of reduced capacitance, as observed in the MOS capacitor 500 of FIG. 5*a*, can be reduced and potentially eliminated by design of the heavily doped wells surrounding the region under an oxide of the MOS capacitor. This is illustrated in FIG. 6*a* by the utilization of an asymmetrical well structure 644. The asymmetrical well structure acts as a source of majority as well as minority carriers. That is, when the MOS capacitor 600 is operated in inversion, the well of equivalent doping type to that of the region under the oxide 616 supplies majority carriers to essentially recombine with minority carriers. This inhibits the buildup of minority carriers in the region 634 and reduces the degree of inversion of the MOS capacitor. This effect is illustrated in FIG. 6*c*. An overall reduction in capacitance change is realized in comparison to the capacitance change observed in inversion in FIG. 5*c*. Thus, the MOS capacitor 600 may be more appropriately viewed as a single capacitor 646 when operated in inversion.

The asymmetrical nature of the MOS capacitor 600 may allow more area for other devices on an integrated circuit. For example, in FIG. 6*a*, the p+ doping 645 may be used as a well contact of the bottom plate connection of the MOS capacitor 600 (to allow an effective contact to a lightly doped or intrinsic region). And, the n+ doping may serve as the source of minority carries to the lightly doped region under the oxide 616. The area normally used for an n+ doping in a symmetrical MOS capacitor (the typical structure of a MOSFET transistor) has been effectively replaced by the p+ well contact. Thus, overall capacitor area is reduced by moving the well contact within the MOS capacitor 600.

FIG. 6*b* illustrates that the asymmetrical well structure continues to allow the MOS capacitor 600 to be operated as a single capacitor 642 in accumulation. There is no resulting decrease in capacitance in accumulation inherent in the asymmetrical design of the MOS capacitor. It is also important to note that because the tunneling and control capacitors of the EEPROM cell are not used as MOS transistors, designing the MOS capacitors in an asymmetrical manner may not reduce functionality of the EEPROM cell.

The asymmetrical MOS capacitor 600 can be incorporated into the embodiments of FIGS. 3*a*-*c* and FIGS. 4*a*-*c*. FIG. 7*a* illustrates an EEPROM memory cell 700 implementing the asymmetrical well structure 744 of FIG. 6*a*-*b*. Similar to the previous embodiments, a gate capacitor 704 (of a MOSFET transistor) implements a symmetrical well structure. A tunneling capacitor 702 and a control capacitor 708, however, utilize an asymmetrical well structure. All of the other features of the previous embodiments, such as lightly doped regions under the oxides of each capacitor 718, a continuous poly line joining each capacitor 712, shallow trench isolation 713 and construction on an SOI substrate (not shown) may be maintained in this embodiment.

FIG. 7*b* illustrates a topographical view of one layout of the tunneling capacitor 702, or the control capacitor 708, of the EEPROM cell 700. An initial well 748 of lightly doped silicon is formed (e.g., by doping in a conventional manner or inherent to the background doping level of the well 748), an oxide 750 is grown (e.g., in a conventional gate oxide process), and asymmetrical dopant regions are created 752 (e.g., by doping in any known method of doping, such as ion implantation) on both sides of the oxide area 750. The asymmetrical doped regions may be electrically isolated by shallow trench isolation 713.

Alternatively, the asymmetrical doped regions may be placed adjacent to each other. FIG. 7c illustrates an alternative layout to that of FIG. 7b. In this embodiment, alternating regions of dopant species 754 are created adjacent to each other. This allows further area optimization of a MOS capacitor and the EEPROM cell. The alternating dopant species 754 serve as a source of majority and minority carries for the inversion or accumulation region under the oxide 750. The p+ component of the alternating doping species 754 may also be used as a well contact for the bottom plate connection of a MOS capacitor. Alternatively, if the well 748 were designed to be n– type, the n+ component may be used as a well contact.

Figure 8B:
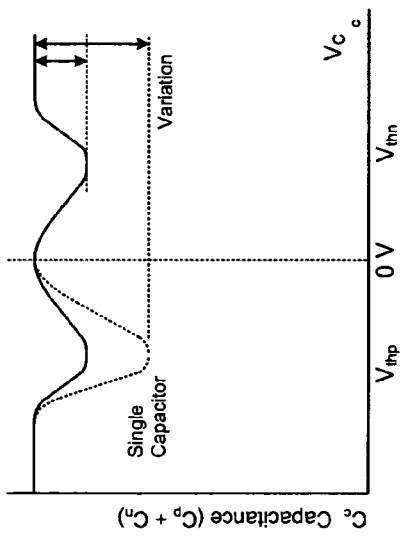
FIG. 8b is an example graph illustrating the reduction in capacitance variation around the threshold voltages of the n-type and p-type channels.
Figure 8A:
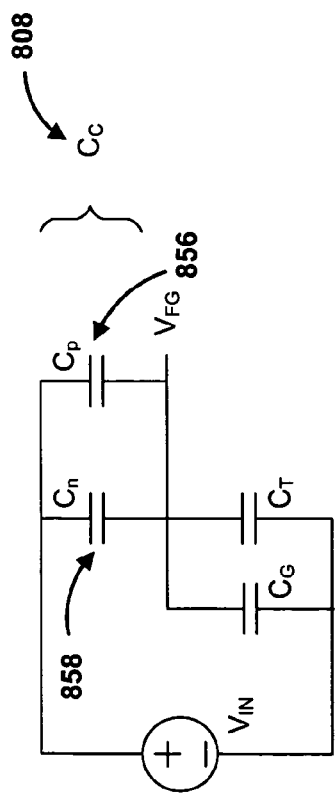
FIG. 8a is a schematic drawing of an example control capacitor comprising a capacitor with an n-type channel doping and a capacitor with a p-type channel doping.

An EEPROM memory cell may also be optimized by constructing it with more than one tunneling or control capacitor. Take for example the control capacitor 108 illustrated in the schematic drawing of FIG. 1b. This can be represented by two control capacitors. One of the two control capacitors may have a p-type lightly doped region and the other may have an n-type lightly doped region. A schematic diagram illustrating this is displayed in FIG. 8a. A p-MOS asymmetrical capacitor 856 and an n-MOS asymmetrical capacitor 858 are connected in parallel. Both of these capacitors comprise a single control capacitor 808. Similar to FIG. 1b, the output voltage can be calculated in terms of the control capacitors, tunneling capacitor, and the input voltage as shown below:

$$V_{FG} = \frac{C_p + C_n}{C_p + C_n + C_T + C_G} \cdot V_{IN}$$

Again, if $C_p+C_n \gg C_T+C_G$ this reduces to:

$$V_{FG} \approx V_{IN}$$

Figure 8C:
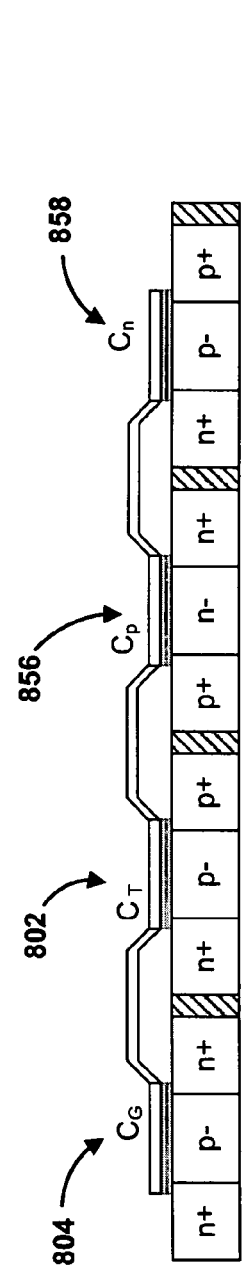
FIG. 8c is a cross-sectional view of a single-poly EEPROM cell implementing a control capacitor comprising a capacitor with an n-type channel doping and a capacitor with a p-type channel doping in accordance with one embodiment of the present invention.

By operating capacitors 856 and 858 in parallel, one capacitor will always be in accumulation. The capacitor in accumulation will reduce the overall variation in capacitance due to the other capacitor being in inversion. The capacitance of capacitors 856 and 858 is displayed in FIG. 8b. The variation in capacitance is reduced over the range of operating voltages. FIG. 8c illustrates the design of an EEPROM cell implementing parallel p-MOS and n-MOS capacitors 856 and 858, for example.

Besides having two control capacitors, two tunneling capacitors may also be used. FIG. 9a illustrates an embodiment of a memory cell 900 implementing a tunneling capacitor comprising p-MOS and n-MOS asymmetrical capacitors 960 and 962. The advantages of using two tunneling capacitors is that capacitors can be designed to operate only in accumulation and thus avoid voltage dependent variations in capacitance, and, depending on the process technology, there may be opportunities to customize tunneling paths for electrons onto and off the floating gate 912. For example, a circuit designer may want to optimize a tunneling capacitor for tunneling electrons onto the gate capacitor. If only one tunneling capacitor is used, any design changes for improved tunneling onto the gate capacitor may have a direct, possibly negative, effect on tunneling electrons off of the gate capacitor. However, by using two tunneling capacitors, namely $C_{T-}$ 960 and $C_{T+}$ 962, a designer can modify either capacitor without directly affecting tunneling onto and off of the floating gate 912.

To perform a "write" operation and tunnel electrons onto the floating gate 912, a negative potential 964 is applied to the bottom plate of the p-MOS tunneling capacitor 960. A positive potential 966a is applied to the n-MOS control capacitor 958. Capacitors 960 and 958 are both biased into accumulation, thereby avoiding variations in capacitance. In this embodiment, asymmetrical p-MOS and n-MOS capacitors, 956 and 958, can be used either independently or collectively as the control capacitor. For example, if a positive potential 966b (or 966a) is also applied to the bottom plate of the p-MOS control capacitor 956, it will be in parallel with the n-MOS control capacitor 958. Even though capacitor 956 will operate in inversion, its capacitance may assist with making the control capacitor as large as possible.

In FIG. 9b, a "write" operation is also performed by tunneling charge off the floating gate 912. This is done by applying a positive potential 968 to the n-MOS tunneling capacitor 962 and applying a negative potential 970a to the bottom plate of p-MOS control capacitor 956. Again, both capacitors are operated in accumulation. In addition, the same negative potential 970b can be applied to the n-MOS capacitor 958. The overall result is a positive charge 926 either displacing negative charge or increasing the net positive charge on the floating gate 912.

Figure 10:
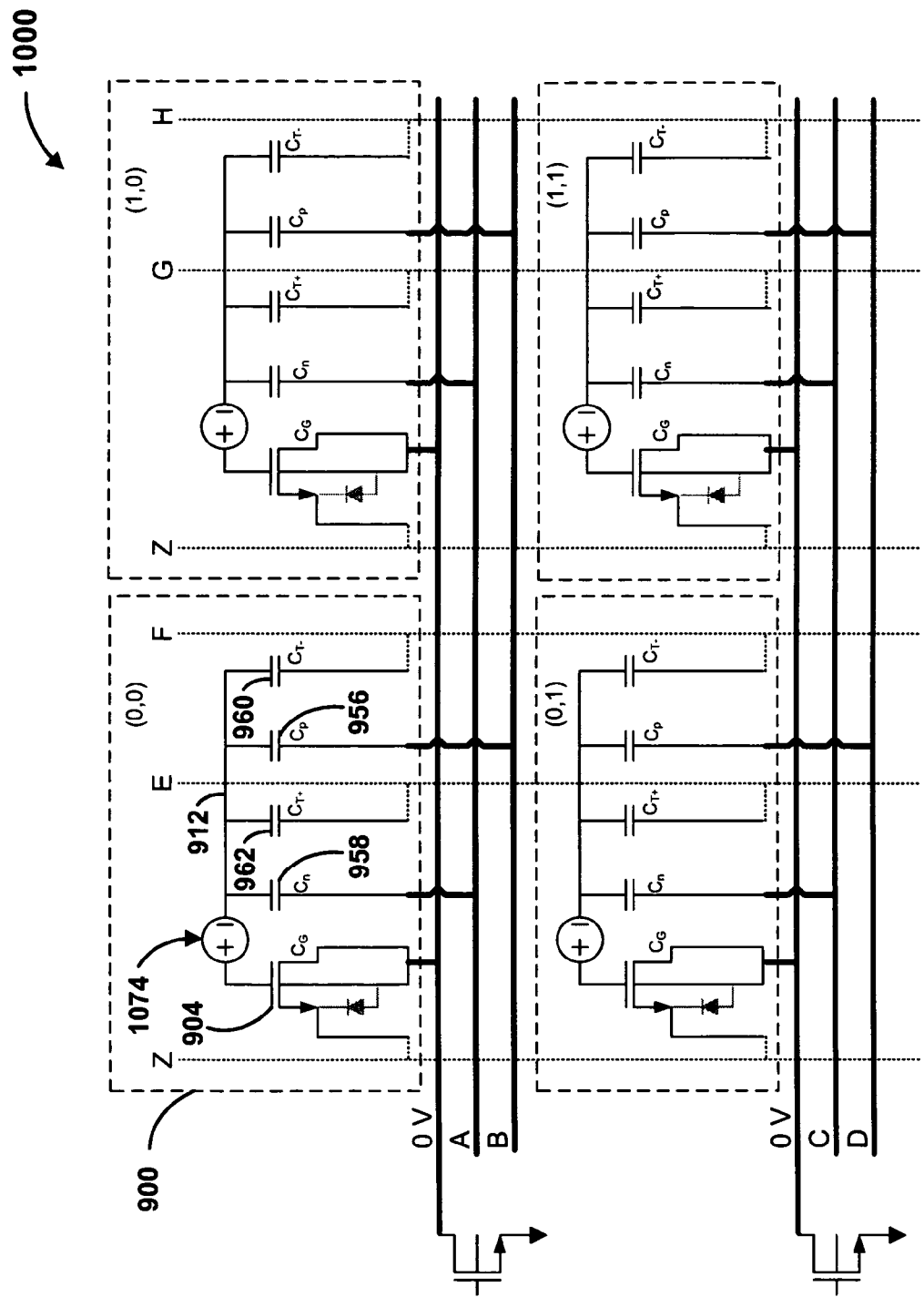
FIG. 10 is a schematic drawing of four single-poly EEPROM cells and a configuration for implementation of writing, erasing and reading the single-poly EEPROM cells in accordance with one embodiment of the present invention.

FIG. 10 is an illustration of a 4-bit memory array 1000 comprised of four EEPROM memory cells 900. A potential can be applied at lines A, B, C, D, E, F, G, and H. Table 1 illustrates the applied voltages which will add or remove electrons to the floating gate of each EEPROM cell 900. When a "write" takes place, electrons are added to or removed from the floating gate 912 and a $V_t$ shift is indicated schematically by the potential 1074. For example, a positive potential, $V_p$, can be placed on lines A and C, and a negative potential, $-V_p$, placed on line F. This would "write" to cells (0,0) and (0,1) by moving electrons onto the floating gate 912 of each of these cells. Electrons could be moved off the cells by applying a negative potential, $-V_p$, to lines B and D and a positive potential, $V_p$, to line E. The memory array 1000 can be made as large or as small as a circuit designer desires by adding additional EEPROM memory cells 900, for example.

TABLE 1

| Cell (0,0) | Cell (1,0) |
|---|---|
| Electrons onto floating gate | Electrons onto floating gate |
| A = Vp   F = –Vp | A = Vp   H = –Vp |
| Electrons off of floating gate | Electrons off of floating gate |
| B = –Vp   E = Vp | B = –Vp   G = Vp |
| Cell (0,1) | Cell (1,1) |
| Electrons onto floating gate | Electrons onto floating gate |
| C = Vp   F = –Vp | C = Vp   H = –Vp |
| Electrons off of floating gate | Electrons off of floating gate |
| D = –Vp   E = Vp | D = –Vp   G = Vp |

The above embodiments describe the design and usage of polysilicon, gate oxide, and silicon layers of a standard CMOS process to build an EEPROM memory cell/array. It is to be understood that the practical ability to build an EEPROM memory cell that can retain charge on the floating gate is a strong function of the type of oxide grown, or deposited, around and on top of the single-poly floating gate; this oxide determines many of the charge leakage paths to and from the floating gate. The above embodiments may be combined with a variety of oxide growth or deposition processes in order to retain an optimum amount of charge on the floating gate.

By using the disclosed structures and method above, an EEPROM memory cell may be manufactured in a typical CMOS process flow. This may be accomplished by using lightly doped well regions, capacitor oxides grown in a gate oxide process and/or a single polysilicon deposition step. Various arrangements such as two or more control or tunneling capacitors also give a circuit designer flexibility in choosing a layout for a memory cell. In addition, asymmetrical MOS capacitors may also provide an added benefit of reduced layout area.

Various methods of applying voltage, such as dividing a voltage bias into components that are distributed to a control and a tunneling capacitor may also reduce problems associated with deleterious effects such as tunneling thorough the oxide of the MOSFET and process voltage breakdown limitations. It should be understood that the illustrated embodiments are examples only and should not be taken as limiting the scope of the present invention. For example, an EEPROM memory cell can be constructed with any combination of disclosed tunneling and control capacitors. Depending on the design, a plurality of control and tunneling capacitors could be implemented to optimize an EEPROM memory cell. It is also understood that various processing methods may be used to construct the disclosed EEPROM cells. The claims should not be read as limited to the described order or elements unless stated to that effect. Therefore, all embodiments that come within the scope and spirit of the following claims and equivalents thereto are claimed as the invention.

We claim:

1. A single-poly memory cell comprising:
   a floating polysilicon gate for storing a charge, the polysilicon gate located on top of an oxide layer grown in a gate oxidation process;
   a MOSFET transistor having a gate that is a first portion of the polysilicon gate and a first portion of the oxide layer;
   a MOS control capacitor having a top plate, a dielectric, a bottom plate and a contact, the top plate being a second portion of the polysilicon gate, the dielectric being a second portion of the oxide layer, and the bottom plate comprising a lightly doped region under the dielectric, a first doped region adjacent to the lightly doped region under the dielectric, and a second doped region adjacent to the lightly doped region under the dielectric, wherein the contact is connected to the bottom plate and is operable to receive a first voltage, and wherein the first voltage biases the control capacitor; and
   a MOS tunneling capacitor having a top plate, a dielectric, a bottom plate and a contact, the top plate being a third portion of the polysilicon gate, the dielectric being a third portion of the oxide layer, and the bottom plate comprising a lightly doped region under the dielectric, a third doped region adjacent to the lightly doped region under the dielectric, and a fourth doped region adjacent to the lightly doped region under the dielectric, wherein the contact is connected to the bottom plate and is operable to receive a second voltage, and wherein the second voltage biases the tunneling capacitor.

2. The single-poly memory cell as in claim 1, wherein the lightly doped region under the dielectric of the control capacitor and the lightly doped region under the dielectric of the tunneling capacitor have a doping density less than about $10^{18}$ atoms/cm$^3$.

3. The single-poly memory cell as in claim 1, wherein the lightly doped region under the dielectric of the control capacitor and the lightly doped region under the dielectric of the tunneling capacitor have an intrinsic doping density.

4. The single-poly memory cell as in claim 1, wherein the first doped region and the lightly doped region under the dielectric of the control capacitor have equivalent doping type species and the second doped region and the lightly doped region under the dielectric of the control capacitor have opposite-type doping species.

5. The single-poly memory cell as in claim 4, wherein the first doped region is adjacent to the second doped region.

6. The single-poly memory cell as in claim 1, wherein the third doped region and the lightly doped region under the dielectric of the tunneling capacitor have equivalent doping type species and the fourth doped region and the lightly doped region under the dielectric of the tunneling capacitor have opposite-type doping species.

7. The single-poly memory cell as in claim 6, wherein the third doped region is adjacent to the fourth doped region.

8. The single-poly memory cell as in claim 1, wherein the first doped region and the lightly doped region under the dielectric of the control capacitor have equivalent doping type species and the second doped region and the lightly doped region under the dielectric of the control capacitor have opposite-type doping species, and the third doped region and the lightly doped region under the dielectric of the tunneling capacitor have equivalent doping type species and the fourth doped region and the lightly doped region under the dielectric of the tunneling capacitor have opposite-type doping species.

9. The single-poly memory cell as in claim 8, wherein the first doped region is adjacent to the second doped region and the third doped region is adjacent to the fourth doped region.

10. The single-poly memory cell as in claim 1, wherein the portion of the oxide layer of the dielectric of the tunneling capacitor is grown in the gate oxidation process of the portion of the oxide layer of the gate of the MOSFET transistor.

11. The single-poly memory cell as in claim 1, wherein the portion of the oxide layer of the dielectric of the control capacitor is grown in the gate oxidation process of the gate oxide portion of the oxide layer of the gate of the MOSFET transistor.

12. The single-poly memory cell as in claim 1, wherein the single-poly memory cell is constructed on a silicon-on-insulator substrate.

13. The single-poly memory cell as in claim 1, wherein the bottom plate of the control and tunneling capacitors further comprises a heavily doped region in between the lightly doped region under the dielectric of the control and tunneling capacitors and the contact of the control and tunneling capacitors so as to provide an ohmic connection to the control and tunneling capacitors.

* * * * *